US009686855B2

(12) United States Patent
Ishikawa et al.

(10) Patent No.: US 9,686,855 B2
(45) Date of Patent: Jun. 20, 2017

(54) MULTILAYER CERAMIC CAPACITOR WITH INTERPOSER, AND INTERPOSER FOR MULTILAYER CERAMIC CAPACITOR

(71) Applicant: TAIYO YUDEN CO., LTD., Taito-ku, Tokyo (JP)

(72) Inventors: Kazuya Ishikawa, Takasaki (JP); Nobuhiro Sasaki, Takasaki (JP); Hideo Ishihara, Takasaki (JP); Katsunosuke Haga, Takasaki (JP)

(73) Assignee: TAIYO YUDEN CO., LTD, Tokyo (JP)

( * ) Notice: Subject to any disclaimer, the term of this patent is extended or adjusted under 35 U.S.C. 154(b) by 0 days.

(21) Appl. No.: 14/768,424

(22) PCT Filed: Feb. 12, 2014

(86) PCT No.: PCT/JP2014/053145
§ 371 (c)(1),
(2) Date: Aug. 17, 2015

(87) PCT Pub. No.: WO2014/126084
PCT Pub. Date: Aug. 21, 2014

(65) Prior Publication Data
US 2016/0007446 A1    Jan. 7, 2016

(30) Foreign Application Priority Data

Feb. 18, 2013  (JP) .................................. 2013028821
Dec. 26, 2013  (JP) .................................. 2013268352

(51) Int. Cl.
*H05K 1/02* (2006.01)
*H05K 1/11* (2006.01)
(Continued)

(52) U.S. Cl.
CPC ............. *H05K 1/0216* (2013.01); *H01G 4/12* (2013.01); *H01G 4/232* (2013.01); *H01G 4/30* (2013.01);
(Continued)

(58) Field of Classification Search
CPC .................................. H05K 3/34; H05K 1/18
(Continued)

(56) References Cited

U.S. PATENT DOCUMENTS 5,459,642 A  *  10/1995  Stoddard .............. H05K 1/0231
                                                           174/260
8,878,339 B2 *  11/2014  Hattori .................... H01L 28/40
                                                           257/532
(Continued)

FOREIGN PATENT DOCUMENTS

JP      2004134430 A    4/2004
JP      2004193352 A    7/2004
(Continued)

OTHER PUBLICATIONS

Notification of Transmittal of Translation of the International Preliminary Report on Patentability (PCT/IB/338) mailed Aug. 27, 2015, with International Preliminary Report on Patentability (PCT/IB/373) and Written Opinion of the International Searching Authority (PCT/ISA/237), for corresponding international application PCT/JP2014/053145.
(Continued)

*Primary Examiner* — Timothy Thompson
*Assistant Examiner* — Michael F McAllister
(74) *Attorney, Agent, or Firm* — Law Office of Katsuhiro Arai

(57) ABSTRACT

An embodiment of an multilayer ceramic capacitor with interposer includes: an interposer 20 having an insulated substrate 21, two first conductor pads 22, two second
(Continued)

conductor pads 23 and two conductor vias 24 connecting the first conductor pads 22 and second conductor pads 23; and a multilayer ceramic capacitor 10 having external electrodes 12 that are each connected to each first conductor pad 22 of the interposer 20 via solder SOL. Each conductor via 24 of the interposer 20 has a through hole 24a inside, and a void GA not filled with the solder SOL is present in each through hole 24a on the second conductor pad 23 side. The multilayer ceramic capacitor with interposer is capable of suppressing noise due to electrostriction.

18 Claims, 8 Drawing Sheets

(51) Int. Cl.
　　H01G 4/30　　　(2006.01)
　　H01G 4/12　　　(2006.01)
　　H01G 4/232　　(2006.01)
　　H05K 1/18　　　(2006.01)
(52) U.S. Cl.
　　CPC ............. *H05K 1/113* (2013.01); *H05K 1/181* (2013.01); *H05K 2201/09481* (2013.01); *H05K 2201/10015* (2013.01); *H05K 2201/10378* (2013.01); *H05K 2201/10636* (2013.01); *Y02P 70/611* (2015.11)

(58) Field of Classification Search
　　USPC ......... 174/68.3, 504, 101, 117 A; 361/321.2, 361/303, 306.1, 306.3
　　See application file for complete search history.

(56) References Cited

U.S. PATENT DOCUMENTS

2004/0066589 A1*　4/2004　Togashi ............... H01G 2/065
　　　　　　　　　　　　　　　　　　　　　　　　361/15
2008/0003846 A1*　1/2008　Miyagawa ........... H05K 1/0231
　　　　　　　　　　　　　　　　　　　　　　　　439/71

FOREIGN PATENT DOCUMENTS

JP　　2004-335657　　*　11/2004
JP　　2012-204572　　*　10/2012
JP　　2012204572　A　　10/2012

OTHER PUBLICATIONS

International Search Report (ISR) mailed Mar. 25, 2014, issued for International application No. PCT/JP2014/053145.

* cited by examiner

MULTILAYER CERAMIC CAPACITOR WITH INTERPOSER, AND INTERPOSER FOR MULTILAYER CERAMIC CAPACITOR

TECHNICAL FIELD

The present invention relates to a multilayer ceramic capacitor with interposer comprising a multilayer ceramic capacitor and an interposer installed on it, as well as an interposer for multilayer ceramic capacitor used for mounting a multilayer ceramic capacitor on a substrate, etc.

BACKGROUND ART

FIG. 1 is a top view of a conventional multilayer ceramic capacitor with interposer, FIG. 2 is a partial cross sectional side view of the multilayer ceramic capacitor with interposer shown in FIG. 1, and FIG. 3 is a partial cross sectional side view of the multilayer ceramic capacitor with interposer shown in FIG. 1 and FIG. 2, being mounted on a substrate.

It should be noted that, in the explanations provided herein, a multilayer ceramic capacitor with interposer is simply referred to as "capacitor with interposer," while a multilayer ceramic capacitor is simply referred to as "capacitor," for the sake of convenience of description. Additionally, the dimension in the lateral direction in FIG. 1 and FIG. 2 is referred to as "length," the dimension in the vertical direction in FIG. 1 is referred to as "width," and the dimension in the vertical direction in FIG. 2 is referred to as "height."

The capacitor with interposer shown in FIG. 1 and FIG. 2 comprises a capacitor 100, interposer 200, and solder SOL joining the two (refer to Patent Literature 1 below, for example).

As shown in FIG. 1 and FIG. 2, the capacitor 100 is structured in such a way that it has: a dielectric chip 101 of roughly rectangular solid shape that houses multiple internal electrode layers (not illustrated) stacked in its height direction in a manner not contacting each other; and two external electrodes 102 each provided on one of the opposite end faces (end faces in the length direction) of the dielectric chip 101 in a manner partially covering the four side faces adjoining the end face and where the area partially covering the four side faces has four side faces of roughly rectangular shape; wherein the ends of some of the multiple internal electrode layers (such as odd-numbered ones from the top) are connected to one of the two external electrodes 102, while the ends of the others (such as even-numbered ones from the top) are connected to the other of the two external electrodes 102.

On the other hand, as shown in FIG. 1 and FIG. 2, the interposer 200 is structured in such a way that it has: an insulated substrate 201 of roughly rectangular sheet shape; two first conductor pads 202 of roughly rectangular shape provided on one side (top side) of the insulated substrate 201 in its thickness direction in a manner each facing one side face of roughly rectangular shape of each of the two external electrodes 102; two second conductor pads 203 of roughly rectangular shape provided on the other side (bottom side) of the insulated substrate 201 in its thickness direction in a manner facing the two first conductor pads 202, respectively; and two connection conductors 204 of roughly semi-cylindrical shape provided on the end faces of the insulated substrate 201 in its length direction, respectively; wherein one of the two first conductor pads 202 is connected to one of the two second conductor pads 203 via one of the two connection conductors 204, while the other of the two first conductor pads 202 is connected to the other of the two second conductor pads 203 via the other of the two connection conductors 204. Since the two connection conductors 204 have a roughly semi-cylindrical shape, they each have a concaved part 205 on the inner side extending in the height direction of the interposer 200.

As is evident from FIG. 2, the two first conductor pads 202 of the interposer 200 each has joined to its surface (top side), via solder SOL, one side face (bottom side) of roughly rectangular shape of each of the two external electrodes 102 of the capacitor 100.

To mount the capacitor with interposer shown in FIG. 1 and FIG. 2 on a substrate 300, cream solder is applied to the surfaces (top sides) of two conductor pads 302 provided on the surface (top side) of a substrate body 301, and the capacitor with interposer is placed in such a way that the surfaces (bottom faces) of the second conductor pads 203 contact the applied cream solder, after which the cream solder is melted by the reflow soldering method or other heat treatment and then cured, to join each second conductor pad 203 to each conductor pad 302 on the substrate 300 via solder SOL (refer to FIG. 3). It should be noted that each conductor pad 302 of the substrate 300 has a roughly rectangular profile slightly larger than that of each second conductor pad 203.

Since the capacitor with interposer shown in FIG. 1 and FIG. 2 has two connection conductors 204 of roughly semi-cylindrical shape present on the end faces of the insulated substrate 201 of the interposer 200 in its length direction, with each connection conductor 204 having the concaved part 205 on the inner side extending in the height direction of the interposer 200, as shown in FIG. 3, the melting of the cream solder and the solder SOL of the capacitor with interposer causes the molten solder to wet the end face of each external electrode 102 of the capacitor 100 via each concaved part 205 to form a fillet SOLa extending from the surface of each conductor pad 302 of the substrate 300 to the end face of each external electrode 102 of the capacitor 100.

Incidentally, if electrostriction occurs in the dielectric chip 101 due to application of voltage, especially application of alternating-current voltage, to the capacitor 100 in the mounted condition shown in FIG. 3 (repetition of a decrease in the length and increase in the height of the dielectric chip 101 (refer to the arrows) and restoration of the original length and height), this electrostriction may cause the substrate 201 to warp and then restore its original shape repeatedly to generate vibration, with the vibration generating so-called noise. Particularly when the fillets SOLa shown in FIG. 3 have been formed, tensile forces (refer to the thick arrows) based on these fillets SOLa act upon the substrate 300 to increase the warping of the substrate 300 and make it easier for the noise to generate.

BACKGROUND ART LITERATURE

Patent Literature

Patent Literature 1: Japanese Patent Laid-open No. 2012-204572

SUMMARY OF THE INVENTION

Problems to be Solved by the Invention

The object of the present invention is to provide a multilayer ceramic capacitor with interposer capable of suppressing noise due to electrostriction, as well as an interposer for multilayer ceramic capacitor.

Means for Solving the Problems

To achieve the aforementioned object, the multilayer ceramic capacitor with interposer proposed by the present invention is a multilayer ceramic capacitor with interposer comprising a multilayer ceramic capacitor and an interposer installed on it, wherein: (1) the multilayer ceramic capacitor is structured in such a way that it has: a dielectric chip of roughly rectangular solid shape that houses multiple internal electrode layers stacked in a manner not contacting each other; and two external electrodes each provided on one of the opposite end faces of the dielectric chip in a manner partially covering the four side faces adjoining the end face and where the area partially covering the four side faces has four side faces of roughly rectangular shape; wherein the ends of some of the multiple internal electrode layers are connected to one of the two external electrodes, while the ends of the others are connected to the other of the two external electrodes; (2) the interposer is structured in such a way that it has: an insulated substrate of roughly rectangular sheet shape; two first conductor pads of roughly rectangular shape provided on one side of the insulated substrate in its thickness direction in a manner each facing one side face of roughly rectangular shape of each of the two external electrodes; two second conductor pads provided on the other side of the insulated substrate in its thickness direction in a manner facing the two first conductor pads, respectively; and one or more one-side conductor vias provided on the insulated substrate in a manner penetrating through it in its thickness direction, at a location(s) on the inner side of the outer edge of one of the two first conductor pads and of the outer edge of one of the two second conductor pads, as well as one or more other-side conductor vias provided on the insulated substrate in a manner penetrating through it in its thickness direction, at a location(s) on the inner side of the outer edge of the other of the two first conductor pads and of the outer edge of the other of the two second conductor pads; wherein one of the two first conductor pads is connected to one of the two second conductor pads via the one or more one-side conductor vias, while the other of the two first conductor pads is connected to the other of the two second conductor pads via the one or more other-side conductor vias; (3) the two first conductor pads of the interposer each have joined to its surface, via solder, one side face of roughly rectangular shape of each of the two external electrodes of the multilayer ceramic capacitor; (4) the one or more one-side conductor vias each have a through hole inside that opens at the surface of one of the two first conductor pads and at the surface of one of the two second conductor pads, while the one or more other-side conductor vias each have a through hole inside that opens at the surface of the other of the two first conductor pads and at the surface of the other of the two second conductor pads; and (5) voids not filled with the solder are present in the through hole(s) of the one or more one-side conductor vias on the surface side of one of the two second conductor pads, and also in the through hole(s) of the one or more other-side conductor vias on the surface side of the other of the two second conductor pads.

Additionally, the interposer proposed by the present invention is an interposer for multilayer ceramic capacitor used for mounting a multilayer ceramic capacitor on a substrate, etc., wherein: (1) the multilayer ceramic capacitor is structured in such a way that it has: a dielectric chip of roughly rectangular solid shape that houses multiple internal electrode layers stacked in a manner not contacting each other; and two external electrodes each provided on one of the opposite end faces of the dielectric chip in a manner partially covering the four side faces adjoining the end face and where the area partially covering the four side faces has four side faces of roughly rectangular shape; wherein the ends of some of the multiple internal electrode layers are connected to one of the two external electrodes, while the ends of the others are connected to the other of the two external electrodes; (2) the interposer is structured in such a way that it has: an insulated substrate of roughly rectangular sheet shape; two first conductor pads of roughly rectangular shape provided on one side of the insulated substrate in its thickness direction in a manner each facing one side face of roughly rectangular shape of each of the two external electrodes; two second conductor pads provided on the other side of the insulated substrate in its thickness direction in a manner facing the two first conductor pads, respectively; and one or more one-side conductor vias provided in a manner penetrating through the insulated substrate in its thickness direction, on the inner side of the outer edge of one of the two first conductor pads and of the outer edge of one of the two second conductor pads, as well as one or more other-side conductor vias provided in a manner penetrating through the insulated substrate in its thickness direction, on the inner side of the outer edge of the other of the two first conductor pads and of the outer edge of the other of the two second conductor pads; wherein one of the two first conductor pads is connected to one of the two second conductor pads via the one or more one-side conductor vias, while the other of the two first conductor pads is connected to the other of the two second conductor pads via the one or more other-side conductor vias; (3) the two first conductor pads of the interposer are each used to join, via solder, one side face of roughly rectangular shape of each of the two external electrodes of the multilayer ceramic capacitor; and (4) the one or more one-side conductor vias each have a through hole inside that opens at the surface of one of the two first conductor pads and at the surface of one of the two second conductor pads, while the one or more other-side conductor vias each have a through hole inside that opens at the surface of the other of the two first conductor pads and at the surface of the other of the two second conductor pads.

Effects of the Invention

According to the present invention, a multilayer ceramic capacitor with interposer capable of suppressing noise due to electrostriction, as well as an interposer for multilayer ceramic capacitor, can be provided.

The aforementioned and other objects of the present invention and the characteristics and effects according to each of the objects are made clear by the explanations below and drawings attached hereto.

MODES FOR CARRYING OUT THE INVENTION

First Embodiment (FIG. 4 to FIG. 8)

Figure 4:
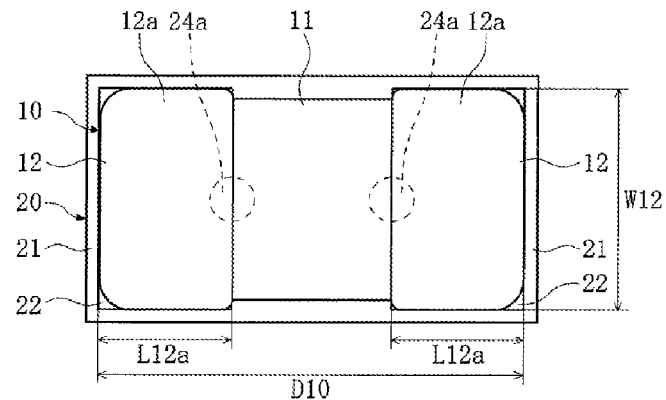
FIG. 4 is a top view of a multilayer ceramic capacitor with interposer constituting a first embodiment of the present invention.
Figure 5:
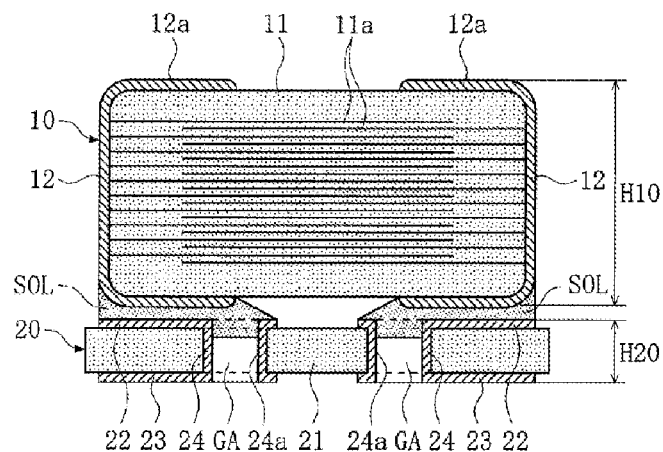
FIG. 5 is a longitudinal section view of the multilayer ceramic capacitor with interposer shown in FIG. 4.
Figure 6:
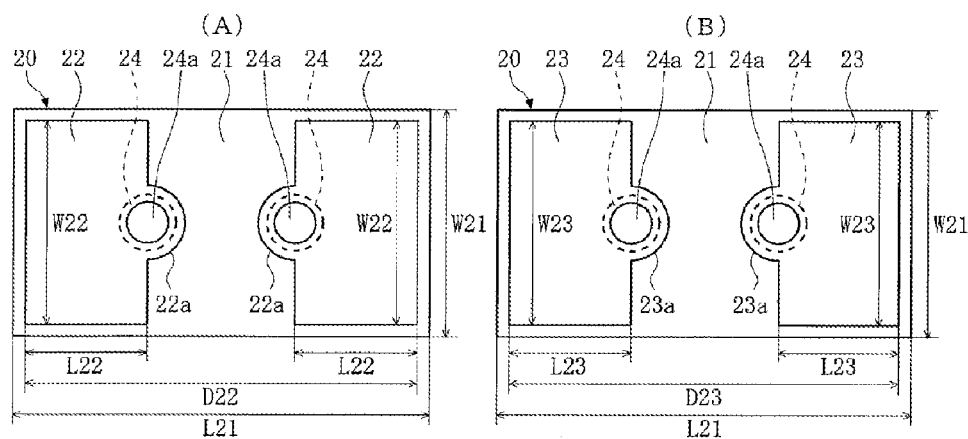
FIG. 6 (A) is a top view of the interposer shown in FIG. 4 and FIG. 5, while FIG. 6 (B) is a bottom view of the interposer shown in FIG. 4 and FIG. 5.
Figure 7:
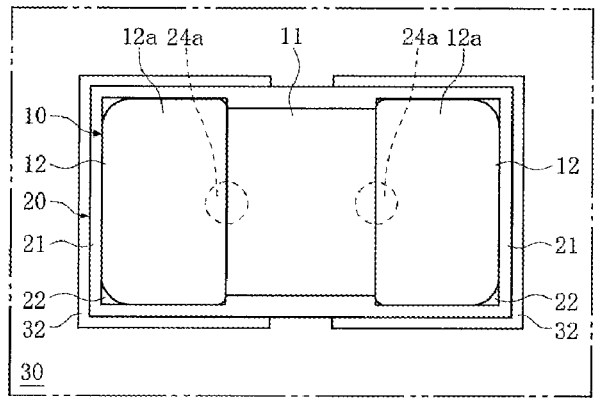
FIG. 7 is a top view of the multilayer ceramic capacitor with interposer shown in FIG. 4 and FIG. 5, being mounted on a substrate.
Figure 8:
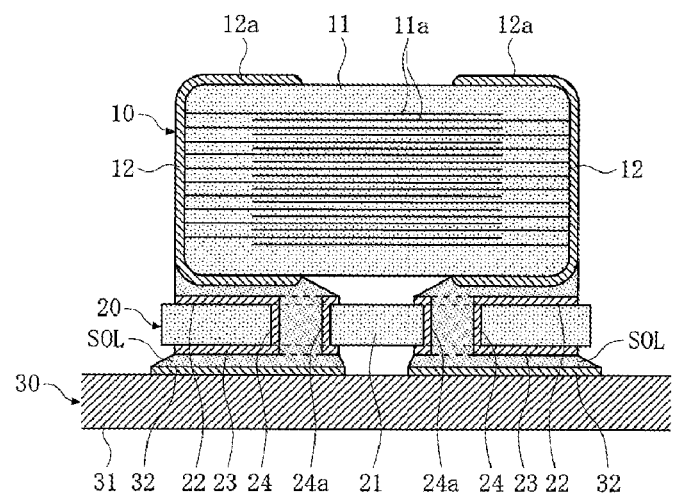
FIG. 8 is longitudinal section view of the multilayer ceramic capacitor with interposer shown in FIG. 4 and FIG. 5, being mounted on a substrate.

FIG. 4 is a top view of a multilayer ceramic capacitor with interposer constituting the first embodiment of the present invention, FIG. 5 is a longitudinal section view of the multilayer ceramic capacitor with interposer shown in FIG. 4, FIG. 6 (A) is a top view of the interposer shown in FIG. 4 and FIG. 5, while FIG. 6 (B) is a bottom view of the interposer shown in FIG. 4 and FIG. 5, FIG. 7 is a top view of the multilayer ceramic capacitor with interposer shown in FIG. 4 and FIG. 5, being mounted on a substrate, and FIG. 8 is longitudinal section view of the multilayer ceramic capacitor with interposer shown in FIG. 4 and FIG. 5, being mounted on a substrate.

It should be noted that, in the explanations provided herein, a multilayer ceramic capacitor with interposer is simply referred to as "capacitor with interposer," while a multilayer ceramic capacitor is simply referred to as "capacitor," for the sake of convenience of description. Additionally, the dimension in the lateral direction in FIG. 4 and FIG. 5 is referred to as "length," the dimension in the vertical direction in FIG. 4 is referred to as "width," and the dimension in the vertical direction in FIG. 5 is referred to as "height."

The capacitor with interposer shown in FIG. 4 and FIG. 5 comprises a capacitor 10, interposer 20, and solder SOL joining the two.

As shown in FIG. 4 and FIG. 5, the capacitor 10 is structured in such a way that it has: a dielectric chip 11 of roughly rectangular solid shape that houses multiple (a total of 20 in FIG. 5) internal electrode layers 11a stacked in its height direction in a manner not contacting each other; and two external electrodes 12 each provided on one of the opposite end faces (end faces in the length direction) of the dielectric chip 11 in a manner partially covering the four side faces adjoining the end face and where the area partially covering the four side faces (side face part 12a) has four side faces of roughly rectangular shape; wherein the ends of some of the multiple internal electrode layers 11a (such as odd-numbered ones from the top) are connected to one (on the left side) of the two external electrodes 12, while the ends of the others (such as even-numbered ones from the top) are connected to the other (on the right side) of the two external electrodes 12. Although the total number of internal electrode layers 11a is 20 in FIG. 5 for the sake of convenience of illustration, the total number of internal electrode layers 11a in the actual capacitor 10 is 100 or more. This capacitor 10 forms a roughly rectangular solid shape having the overall basic dimensions of Length>Width=Height.

The dielectric chip 11 is constituted by barium titanate, strontium titanate, calcium titanate, magnesium titanate, calcium zirconate, calcium titanate zirconate, barium zirconate, titanium oxide, or other dielectric ceramics, or preferably dielectric ceramics of ∈>1000 or Class 2 (high dielectric constant type), where the layer-shaped areas present between pairs of internal electrode layers 11a have roughly the same thickness. Each internal electrode layer 11a is constituted by a metal such as nickel, copper, palladium, platinum, silver, gold or alloy thereof, and has roughly the same thickness and shape in top view (roughly rectangular). Each external electrode 12 has a two-layer structure consisting of a base layer contacting the dielectric chip 11 and a surface layer formed on the surface of the base layer, or multilayer structure consisting of a base layer, a surface layer, and at least one intermediate layer in between, where the base layer is constituted by a metal such as nickel, copper, palladium, platinum, silver, gold or alloy thereof, the surface layer is constituted by a metal such as tin, palladium, gold, or zinc, and the intermediate layer is constituted by a metal such as platinum, palladium, gold, copper, or nickel.

On the other hand, as shown in FIG. 4 to FIG. 6, the interposer 20 is structured in such a way that it has: an insulated substrate 21 of roughly rectangular sheet shape; two first conductor pads 22 of roughly rectangular shape provided on one side (top side) of the insulated substrate 21 in its thickness direction in a manner each facing one side face of roughly rectangular shape of each of the two external electrodes 12; two second conductor pads 23 of roughly rectangular shape provided on the other side (bottom side) of the insulated substrate 21 in its thickness direction in a manner facing the two first conductor pads 22, respectively; and one or more one-side conductor vias 24 provided on the insulated substrate 21 in a manner penetrating through it in its thickness direction, at a location(s) on the inner side of the outer edge of one (on the left side) of the two first conductor pads 22 and of the outer edge of one (on the left side) of the two second conductor pads 23, as well as one or more other-side conductor vias 24 provided on the insulated substrate in a manner penetrating through it in its thickness direction, at a location(s) on the inner side of the outer edge of the other (on the right side) of the two first conductor pads and of the outer edge of the other (on the right side) of the two second conductor pads; wherein one of the two first conductor pads 22 is connected to one of the two second conductor pads 23 via the one or more one-side conductor vias 24, while the other of the two first conductor pads 22 is connected to the other of the two second conductor pads 23 via the one or more other-side conductor vias 24.

Each conductor via 24 forms a roughly cylindrical shape, where the one-side conductor via 24 has a through hole 24a of roughly columnar shape inside that opens at the surface (top side) of one (on the left side) of the two first conductor pads 22 and the surface (bottom side) of one (on the left side) of the two second conductor pads 23, while the other-side conductor via 24 has a through hole 24a of roughly columnar shape inside that opens at the surface (top side) of the other (on the right side) of the two first conductor pads 22 and the surface (bottom side) of the other (on the right side) of the two second conductor pads 23. It should be noted that each first conductor pad 22 has an overhang part 22a of roughly semi-circular shape provided on it, while each second conductor pad 23 has an overhang part 23a of roughly semi-circular shape provided on it, in order to arrange each conductor via 24 close to the center of the insulated substrate 21 in its length direction by keeping to a minimum any increase in the area of each first conductor pad 22 and the area of each second conductor pad 23. This interposer 20 forms a roughly rectangular sheet shape having the overall basic dimensions of Length>Width>Height.

The insulated substrate 21 is constituted by silicon dioxide, aluminum oxide, silicon nitride or other ceramic, or epoxy resin, phenol resin, polyimide resin, urea resin, melamine resin, unsaturated polyester resin, bismaleimide resin, polyurethane resin, diaryl phthalate resin, silicone resin, cyanate resin or other thermosetting plastic, or thermosetting plastic being any of the foregoing that contains a reinforcing filler. Each first conductor pad 22, each second conductor pad 23, and each conductor via 24 are constituted by a metal such as nickel, copper, palladium, platinum, silver, gold or alloy thereof, and each first conductor pad 22 and each second conductor pad 23 have roughly the same thickness.

As is evident from FIG. 5, one side face (bottom side) of roughly rectangular shape of each one of the two external electrodes 12 of the capacitor 10 is joined, via solder SOL, to the surface (top side) of each of the two first conductor pads 22 of the interposer 20. Also, solder SOL is filled in the through hole 24a of each conductor via 24 of the interposer 20 on the surface side (top side) of each first conductor pad 22, and a void GA not filled with solder SOL is present in the through hole 24a of each conductor via 24 on the surface side (bottom side) of the second conductor pad 23. Although the percentage of the volume of the void GA to the total volume of each through hole 24a is roughly 70% in FIG. 5, this percentage changes according to the amount of solder SOL filled in each through hole 24a on the surface side (top side) of each first conductor pad 22. This percentage change is explained later.

Here, the dimensions of the capacitor 10 and interposer 20 and dimensional relationships of both are explained.

In FIG. 4 and FIG. 5, D10 indicates the end face distance between the two external electrodes 12 (corresponding to the length of the capacitor 10, being a distance in the direction specifying the length L21 of the insulated substrate 21 mentioned later), W12 indicates the width of each external electrode 12 (corresponding to the width of the capacitor 10), H10 indicates the height of the capacitor 10, and L12a indicates the length of the side face part 12a of each external electrode 12. In FIG. 5 and FIG. 6, on the other hand, L21 indicates the length of the insulated substrate 21 (corresponding to the length of the interposer 20), W21 indicates the width of the insulated substrate 21 (corresponding to the width of the interposer 20), H20 indicates the height of the interposer 20, L22 indicates the length of each first conductor pad 22 (not including the overhang part 22a), W22 indicates the width of each first conductor pad 22, D22 indicates the outermost end distance between the two first conductor pads 22, L23 indicates the length of each second conductor pad 23 (not including the overhang part 23a), W23 indicates the width of each second conductor pad 23, and D23 indicates the outermost end distance between the two second conductor pads 23.

With respect to the dimensions of the capacitor 10, the end face distance D10 between the two external electrodes 12 is larger than the width W12 of each external electrode 12, the width W12 of each external electrode 12 is roughly the same as the height H10 of the capacitor 10, and the length L12a of the side face part 12a of each external electrode 12 is in a range of roughly ⅙ to ⅓ of the end face distance D10 between the two external electrodes 12.

With respect to the dimensions of the interposer 20, the length L22 of each first conductor pad 22 is roughly the same as the length L23 of each second conductor pad 23, the width W22 of each first conductor pad 22 is roughly the same as the width W23 of each second conductor pad 23, the outermost end distance D22 between the two first conductor pads 22 is roughly the same as the outermost end distance D23 between the two second conductor pads 23, the radius of curvature of the overhang part 22a is roughly the same as that of the overhang part 22b, and when the interposer 20 is viewed from above, the profile position of each first conductor pad 22 roughly corresponds to the profile position of each second conductor pad 23. Also, the outermost end distance D22 between the two first conductor pads 22 and outermost end distance D23 between the two second conductor pads 23 are slightly shorter than the length L21 of the insulated substrate 21, and the width W22 of each first conductor pad 22 and width W23 of each second conductor pad 23 are slightly narrower than the width W21 of the insulated substrate 21.

With respect to the dimensional relationships of the capacitor 10 and interposer 20, the outermost end distance D22 between the two first conductor pads 22 of the interposer 20 is roughly the same as the end face distance D10 between the two external electrodes 12 of the capacitor 10. Also, the length L22 of each first conductor pad 22 and length L23 of each second conductor pad 23 of the interposer 20 are roughly the same as the length L12a of the side face part 12a of each external electrode 12 of the capacitor 10. Furthermore, the width W22 of each first conductor pad 22 and width W23 of each second conductor pad 23 of the interposer 20 are roughly the same as the width W12 of each external electrode 12 of the capacitor 10.

For reference, in one example of the dimensions of the capacitor 10 and interposer 20 where the capacitor 10 is of size 2125, the basic dimension of the end face distance D10 between the two external electrodes 12 of the capacitor 10 is 2.0 mm, the basic dimension of the width W12 of each external electrode 12 is 1.25 mm, the basic dimension of the height H10 of the capacitor 10 is 1.25 mm, and the basic dimension of the length L12*a* of the side face part 12*a* of each external electrode 12 is 0.5 mm. On the other hand, the basic dimension of the length L21 of the insulated substrate 21 of the interposer 20 is 2.2 mm, the basic dimension of the width W21 of the insulated substrate 21 is 1.45 mm, the basic dimension of the height H20 of the interposer 20 is 0.5 mm, the basic dimension of the length L22 of each first conductor pad 22 is 0.5 mm, the basic dimension of the width W22 of each first conductor pad 22 is 1.25 mm, the basic dimension of the outermost end distance D22 between the two first conductor pads 22 is 2.0 mm, the basic dimension of the length L23 of each second conductor pad 23 is 0.5 mm, the basic dimension of the width W23 of each second conductor pad 23 is 1.25 mm, and the basic dimension of the outermost end distance D23 between the two second conductor pads 23 is 2.0 mm. In addition, the basic dimension of the thickness of the insulated substrate 21 is 0.3 mm, the basic dimension of the thickness of each first conductor pad 22, each second conductor pad 23 and each conductor via 24 is 30 to 70 μm, and the basic dimension of the bore of each through hole 24*a* is 0.2 to 0.5 mm, or preferably 0.25 mm.

To produce the capacitor with interposer shown in FIG. 4 and FIG. 5, cream solder is applied to the surface (top side) of each first conductor pad 22 of the interposer 20 and the capacitor 10 is placed in such a way that one side face (bottom side) of roughly rectangular shape of each external electrode 12 contacts the applied cream solder, after which the cream solder is melted by the reflow soldering method or other heat treatment and then cured, to join each external electrode 12 to each first conductor pad 22 of the interposer 20 via solder SOL.

Because each conductor via 24 of the interposer 20 is positioned on the inner side of the outer edge of each first conductor pad 22 and also because each conductor via 24 has a through hole 24*a* inside, at the time of the aforementioned placement any excess cream solder is taken at least partially into each through hole 24*a* on the surface side (top side) of the first conductor pad 22, and this means that, by the time the production process is over, solder SOL is slightly filled in each through hole 24*a* on the surface side (top side) of each first conductor pad 22, while a void GA not filled with solder SOL is formed in each through hole 24*a* on the surface side (bottom side) of the second conductor pad 23. In other words, because any excess cream solder can be taken at least partially into each through hole 24*a* on the surface side (top side) of the first conductor pad 22 at the time of the aforementioned placement, the amount of cream solder oozing out to the end face side of each external electrode 12 of the capacitor 10 can be reduced and wetting of the end face of each external electrode 12 of the capacitor 10 by molten solder can be prevented as much as possible.

Although it varies depending on the bore of each through hole 24*a*, the amount of cream solder applied, and so on, the amount of solder SOL filled in the through hole 24*a* of each conductor via 24 by the time the production process is over generally falls in a range of 3 to 50% relative to the total volume of each through hole 24*a*. As a result, the percentage of the volume of the void GA to the total volume of each through hole 24*a* generally falls in a range of 50 to 97%.

On the other hand, to mount the capacitor with interposer shown in FIG. 4 and FIG. 5 on a substrate 30, cream solder is applied to the surface (top side) of each of two conductor pads 32 provided on the surface (top side) of a substrate body 31 and the capacitor with interposer is placed in such a way that the surface (bottom side) of each second conductor pad 23 contacts the applied cream solder, after which the cream solder is melted by the reflow soldering method or other heat treatment and then cured, to join each second conductor pad 23 to each conductor pad 32 of the substrate 30 via solder SOL (refer to FIG. 7 and FIG. 8). It should be noted that each conductor pad 32 of the substrate 30 has a roughly rectangular profile slightly larger than that of each second conductor pad 23.

Because each conductor via 24 of the interposer 20 of the capacitor with interposer is positioned on the inner side of the outer edge of each second conductor pad 23 and also because a void GA not filled with solder SOL is present in the through hole 24*a* of each conductor via 24 on the surface side (bottom side) of each second conductor pad 23 (refer to FIG. 5), at the time of the aforementioned placement any excess cream solder is taken at least partially into the void GA in each through hole 24*a*, and consequently the void GA in each through hole 24*a* is filled with solder SOL by the time the production process is over. In other words, because any excess cream solder can be taken at least partially into the void GA in each through hole 24*a* at the time of the aforementioned placement, the amount of cream solder oozing out to the end face side of the interposer 20 in its length direction can be reduced and wetting of the end face of each external electrode 12 of the capacitor 10 by molten solder traveling along the end face of the interposer 20 in its length direction can be prevented as much as possible, and consequently formation of the fillet SOLa shown in FIG. 3 can be avoided as much as possible.

In FIG. 8, solder SOL is filled in a manner filling the entire void GA of each through hole 24*a* (refer to FIG. 5), and although it varies depending on the bore of each through hole 24*a*, the amount of cream solder applied, and so on, the amount of solder SOL filled in the void GA of each conductor via 24 by the time the production process is over generally falls in a range of 3 to 100% relative to the total volume of each void GA. This means that, when this percentage is 100%, solder SOL is filled in a manner filling the entire void GA of each through hole 24*a*, as shown in FIG. 8, which is beneficial in that the joining strength of the capacitor with interposer to the substrate 30 increases due to the solder SOL filled roughly densely in each through hole 24*a*. If the percentage is less than 100%, on the other hand, space not filled with solder SOL remains in the void GA in each through hole 24*a*; however, each external electrode 12 of the capacitor 10 can still be electrically connected to each conductor pad 32 of the substrate 30 appropriately through each first conductor pad 22, each conductor via 24, and each second conductor pad 23 of the interposer 20.

Figure 1:
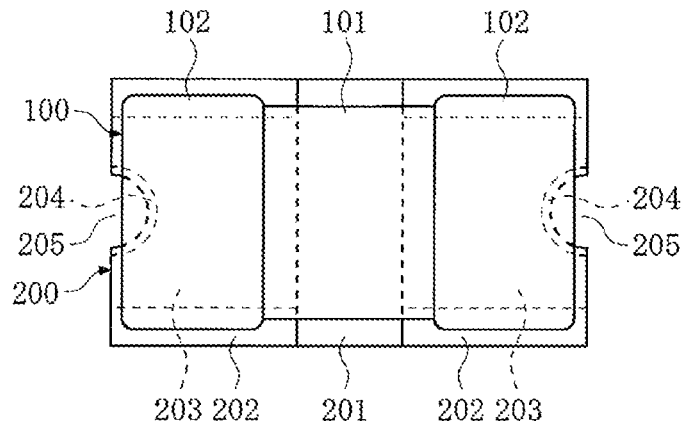
FIG. 1 is a top view of a conventional multilayer ceramic capacitor with interposer.
Figure 2:
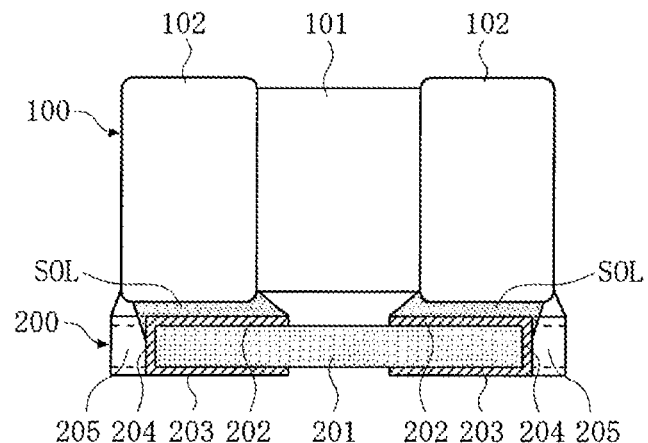
FIG. 2 is a partial cross sectional side view of the multilayer ceramic capacitor with interposer shown in FIG. 1.
Figure 3:
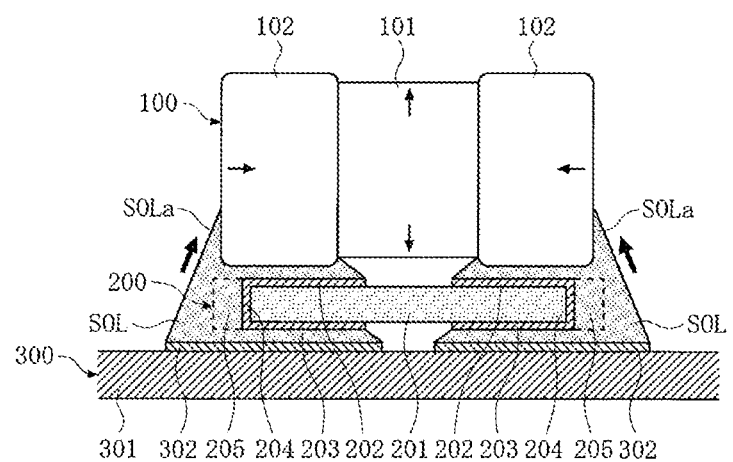
FIG. 3 is a partial cross sectional side view of the multilayer ceramic capacitor with interposer shown in FIG. 1 and FIG. 2, being mounted on a substrate.

This means that, according to the capacitor with interposer shown in FIG. 4 and FIG. 5, the fillet SOLa shown in FIG. 3 does not form easily even when the capacitor with interposer is mounted on the substrate 30 via solder SOL, and warping of the substrate 30 can be reduced by preventing any tensile force due to such fillet SOLa (refer to the thick arrows in FIG. 3) from acting upon it, even when electrostriction occurs in the dielectric chip 11 (repetition of a decrease in the length and increase in the height of the dielectric chip 11 (refer to the arrows in FIG. 3) and restoration of the original length and height) due to application of voltage, especially application of alternating-current voltage, to the capacitor 10 in the mounted condition shown in FIG. 7 and FIG. 8, and this reduction in warping lessens the vibration generating in the substrate 30 and consequently suppresses noise due to electrostriction.

In addition, because a structure can be realized where each external electrode 12 of the capacitor 10 is joined only to each first conductor pad 22 of the interposer 20 via solder SOL and each second conductor pad 23 of the interposer 20 is joined only to each conductor pad 32 of the substrate 30 via solder SOL, warping of the substrate 30 can be reduced more appropriately as the stress transmitted to the substrate 30 from the capacitor 10 as a result of electrostriction occurring in the dielectric chip 11 can be mitigated more appropriately by the interposer 20 present between the capacitor 10 and substrate 30, and this reduction in warping lessens the vibration generating in the substrate 30 more appropriately and consequently suppresses noise due to electrostriction without fail.

Figure 9:
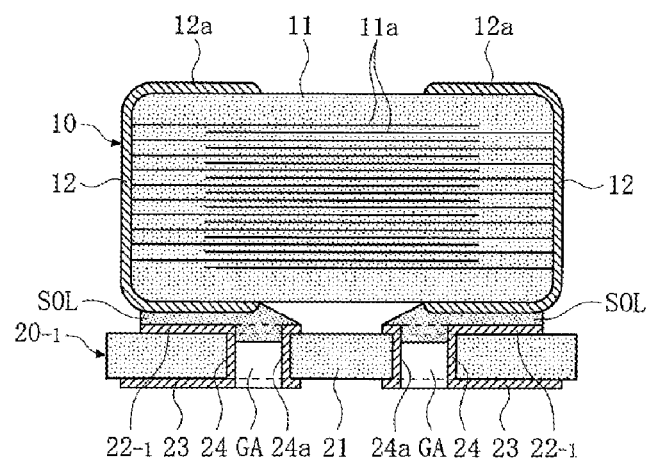
FIG. 9 is a longitudinal section view of a multilayer ceramic capacitor with interposer constituting a second embodiment of the present invention.
Figure 10:
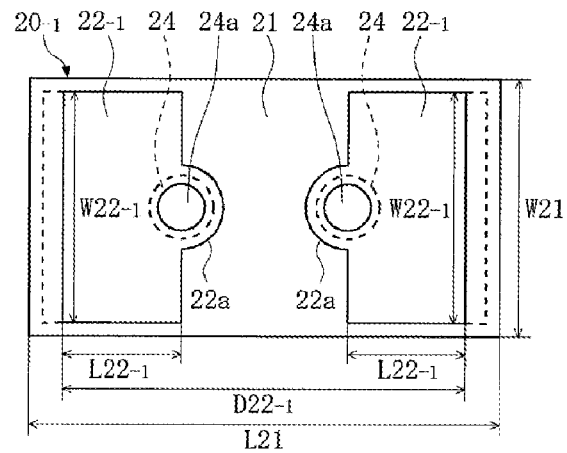
FIG. 10 is a top view of the interposer shown in FIG. 9.
Figure 11:
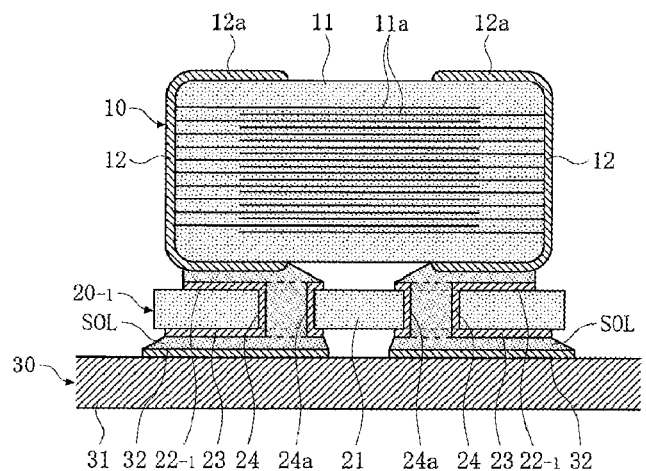
FIG. 11 is a longitudinal section view of the multilayer ceramic capacitor with interposer shown in FIG. 9, being mounted on a substrate.

Second Embodiment (FIG. 9 to FIG. 11)

FIG. 9 is a longitudinal section view of a multilayer ceramic capacitor with interposer constituting the second embodiment of the present invention, FIG. 10 is a top view of the interposer shown in FIG. 9, and FIG. 11 is a longitudinal section view of the multilayer ceramic capacitor with interposer shown in FIG. 9, being mounted on a substrate.

It should be noted that, in the explanations provided herein, a multilayer ceramic capacitor with interposer is simply referred to as "capacitor with interposer," while a multilayer ceramic capacitor is simply referred to as "capacitor," for the sake of convenience of description. Additionally, the dimension in the lateral direction in FIG. 9 and FIG. 10 is referred to as "length," the dimension in the vertical direction in FIG. 10 is referred to as "width," and the dimension in the vertical direction in FIG. 9 is referred to as "height."

The capacitor with interposer shown in FIG. 9 comprises a capacitor 10, interposer 20-1, and solder SOL joining the two. This capacitor with interposer is constitutionally different from the capacitor with interposer shown in FIG. 4 and FIG. 5 (first embodiment) in that, as shown in FIG. 10, the length L22-1 of each first conductor pad 22-1 is made slightly shorter than the length L12a of the side face part 12a of each external electrode 12 of the capacitor 10 so that the outermost end distance D22-1 between the two first conductor pads 22-1 of the interposer 20-1 becomes slightly shorter than the end face distance D10 between the two external electrodes 12 of the capacitor 10. It should be noted that the width W22-1 of each first conductor pad 22-1 is the same as the width W22 shown in FIG. 6 (A).

To produce the capacitor with interposer shown in FIG. 9, cream solder is applied to the surface (top side) of each first conductor pad 22-1 of the interposer 20-1 and the capacitor 10 is placed in such a way that one side face (bottom side) of roughly rectangular shape of each external electrode 12 contacts the applied cream solder, after which the cream solder is melted by the reflow soldering method or other heat treatment and then cured, to join each external electrode 12 to each first conductor pad 22-1 of the interposer 20-1 via solder SOL.

Because each conductor via 24 of the interposer 20-1 is positioned on the inner side of the outer edge of each first conductor pad 22-1 and also because each conductor via 24 has a through hole 24a inside, at the time of the aforementioned placement any excess cream solder is taken at least partially into each through hole 24a on the surface side (top side) of the first conductor pad 22-1, and this means that, by the time the production process is over, solder SOL is slightly filled in each through hole 24a on the surface side (top side) of each first conductor pad 22-1, while a void GA not filled with solder SOL is formed in each through hole 24a on the surface side (bottom side) of the second conductor pad 23. In other words, because any excess cream solder can be taken at least partially into each through hole 24a on the surface side (top side) of the first conductor pad 22-1 at the time of the aforementioned placement, the amount of cream solder oozing out to the end face side of each external electrode 12 of the capacitor 10 can be reduced and wetting of the end face of each external electrode 12 of the capacitor 10 by molten solder can be prevented as much as possible.

Although it varies depending on the bore of each through hole 24a, the amount of cream solder applied, and so on, the amount of solder SOL filled in the through hole 24a of each conductor via 24 by the time the production process is over generally falls in a range of 3 to 50% relative to the total volume of each through hole 24a. As a result, the percentage of the volume of the void GA to the total volume of each through hole 24a generally falls in a range of 50 to 97%.

On the other hand, to mount the capacitor with interposer shown in FIG. 9 on the substrate 30, cream solder is applied to the surface (top side) of each of the two conductor pads 32 provided on the surface (top side) of the substrate body 31 and the capacitor with interposer is placed in such a way that the surface (bottom side) of each second conductor pad 23 contacts the applied cream solder, after which the cream solder is melted by the reflow soldering method or other heat treatment and then cured, to join each second conductor pad 23 to each conductor pad 32 of the substrate 30 via solder SOL (refer to FIG. 11). It should be noted that each conductor pad 32 of the substrate 30 has a roughly rectangular profile slightly larger than that of the bottom side of each second conductor pad 23.

Because each conductor via 24 of the interposer 20-1 of the capacitor with interposer is positioned on the inner side of the outer edge of each second conductor pad 23 and also because a void GA not filled with solder SOL is present in the through hole 24a of each conductor via 24 on the surface side (bottom side) of each second conductor pad 23 (refer to FIG. 9), at the time of the aforementioned placement any excess cream solder is taken at least partially into the void GA in each through hole 24a, and consequently the void GA in each through hole 24a is filled with solder SOL by the time the production process is over. In other words, because any excess cream solder can be taken at least partially into the void GA in each through hole 24a at the time of the aforementioned placement, the amount of cream solder oozing out to the end face side of the interposer 20-1 in its length direction can be reduced and wetting of the end face of each external electrode 12 of the capacitor 10 by molten solder traveling along the end face of the interposer 20-1 in its length direction can be prevented as much as possible, and consequently formation of the fillet SOLa shown in FIG. 3 can be avoided as much as possible.

In FIG. 11, solder SOL is filled in a manner filling the entire void GA of each through hole 24a (refer to FIG. 9), and although it varies depending on the bore of each through hole 24a, the amount of cream solder applied, and so on, the amount of solder SOL filled in the void GA of each conductor via 24 by the time the production process is over generally falls in a range of 3 to 100% relative to the total volume of each void GA. This means that, when this percentage is 100%, solder SOL is filled in a manner filling the entire void GA of each through hole 24a, as shown in FIG. 11, which is beneficial in that the joining strength of the capacitor with interposer to the substrate 30 increases due to the solder SOL filled roughly densely in each through hole 24a. If the percentage is less than 100%, on the other hand, space not filled with solder SOL remains in the void GA in each through hole 24a; however, each external electrode 12 of the capacitor 10 can still be electrically connected to each conductor pad 32 of the substrate 30 appropriately through each first conductor pad 22-1, each conductor via 24, and each second conductor pad 23 of the interposer 20-1.

In essence, effects that are roughly the same as those described in [First Embodiment (FIG. 4 to FIG. 8)] above can also be achieved with the capacitor with interposer shown in FIG. 9.

Figure 12:
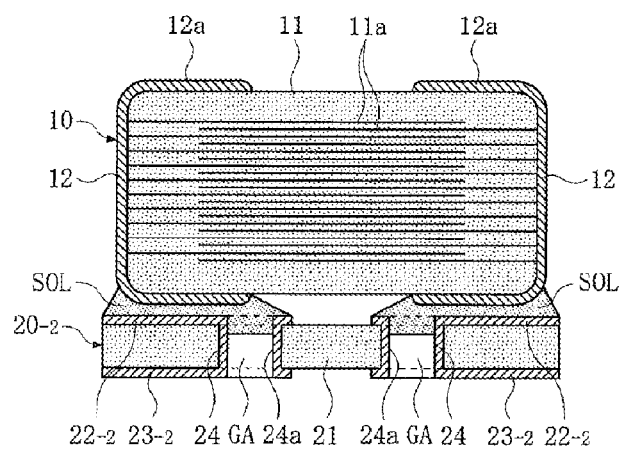
FIG. 12 is a longitudinal section view of a multilayer ceramic capacitor with interposer constituting a third embodiment of the present invention.
Figure 13:
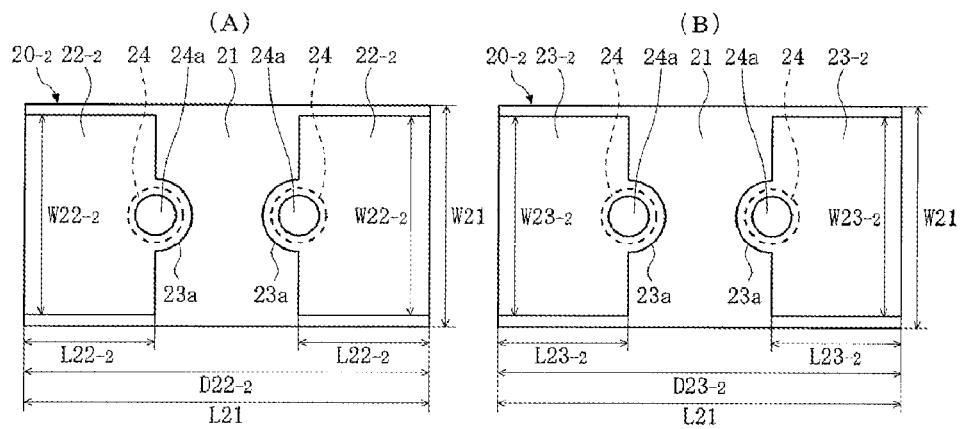
FIG. 13 (A) is a top view of the interposer shown in FIG. 12, while FIG. 13 (B) is a bottom view of the interposer shown in FIG. 12.
Figure 14:
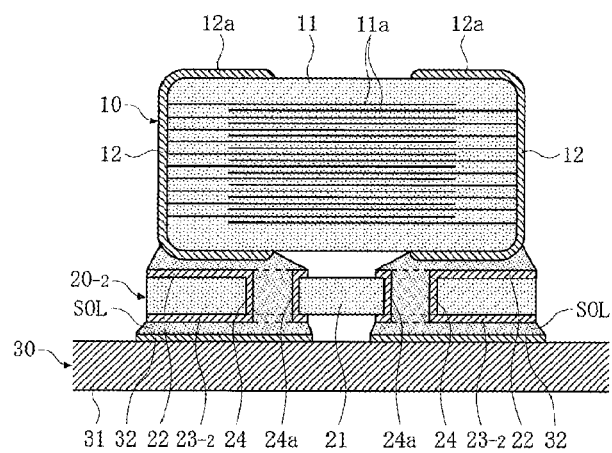
FIG. 14 is a longitudinal section view of the multilayer ceramic capacitor with interposer shown in FIG. 12, being mounted on a substrate.

Third Embodiment (FIG. 12 to FIG. 14)

FIG. 12 is a longitudinal section view of a multilayer ceramic capacitor with interposer constituting the third embodiment of the present invention, FIG. 13 (A) is a top view of the interposer shown in FIG. 12, while FIG. 13 (B) is a bottom view of the interposer shown in FIG. 12, and FIG. 14 is a longitudinal section view of the multilayer ceramic capacitor with interposer shown in FIG. 12, being mounted on a substrate.

It should be noted that, in the explanations provided herein, a multilayer ceramic capacitor with interposer is simply referred to as "capacitor with interposer," while a multilayer ceramic capacitor is simply referred to as "capacitor," for the sake of convenience of description. Additionally, the dimension in the lateral direction in FIG. 12 and FIG. 13 is referred to as "length," the dimension in the vertical direction in FIG. 13 is referred to as "width," and the dimension in the vertical direction in FIG. 12 is referred to as "height."

The capacitor with interposer shown in FIG. 12 comprises a capacitor 10, interposer 20-2, and solder SOL joining the two. This capacitor with interposer is constitutionally different from the capacitor with interposer shown in FIG. 4 and FIG. 5 (first embodiment) in that, as shown in FIG. 13, the length L22-2 of each first conductor pad 22-2 is made slightly longer than the length L12a of the side face part 12a of each external electrode 12 of the capacitor 10 so that the outermost end distance D22-2 between the two first conductor pads 22-2 of the interposer 20-2 becomes roughly the same as the length L21 of the insulated substrate 21, while the length L23-2 of each second conductor pad 23-2 is made slightly longer than the length L12a of the side face part 12a of each external electrode 12 of the capacitor 10 so that the outermost end distance D23-2 between the two second conductor pads 23-2 of the interposer 20-2 becomes roughly the same as the length L21 of the insulated substrate 21. It should be noted that the width W22-2 of each first conductor pad 22-2 is the same as the width W22 shown in FIG. 6 (A), while the width W23-2 of each second conductor pad 23-2 is the same as the width W23 shown in FIG. 6 (B).

To produce the capacitor with interposer shown in FIG. 12, cream solder is applied to the surface (top side) of each first conductor pad 22-2 of the interposer 20-2 and the capacitor 10 is placed in such a way that one side face (bottom side) of roughly rectangular shape of each external electrode 12 contacts the applied cream solder, after which the cream solder is melted by the reflow soldering method or other heat treatment and then cured, to join each external electrode 12 to each first conductor pad 22-2 of the interposer 20-2 via solder SOL.

Because each conductor via 24 of the interposer 20-2 is positioned on the inner side of the outer edge of each first conductor pad 22-2 and also because each conductor via 24 has a through hole 24a inside, at the time of the aforementioned placement any excess cream solder is taken at least partially into each through hole 24a on the surface side (top side) of the first conductor pad 22-2, and this means that, by the time the production process is over, solder SOL is slightly filled in each through hole 24a on the surface side (top side) of each first conductor pad 22-2, while a void GA not filled with solder SOL is formed in each through hole 24a on the surface side (bottom side) of the second conductor pad 23-2. In other words, because any excess cream solder can be taken at least partially into each through hole 24a on the surface side (top side) of the first conductor pad 22-2 at the time of the aforementioned placement, the amount of cream solder oozing out to the end face side of each external electrode 12 of the capacitor 10 can be reduced and wetting of the end face of each external electrode 12 of the capacitor 10 by molten solder can be prevented as much as possible.

Although it varies depending on the bore of each through hole 24a, the amount of cream solder applied, and so on, the amount of solder SOL filled in the through hole 24a of each conductor via 24 by the time the production process is over generally falls in a range of 3 to 50% relative to the total volume of each through hole 24a. As a result, the percentage of the volume of the void GA to the total volume of each through hole 24a generally falls in a range of 50 to 97%.

On the other hand, to mount the capacitor with interposer shown in FIG. 12 on the substrate 30, cream solder is applied to the surface (top side) of each of the two conductor pads 32 provided on the surface (top side) of the substrate body 31 and the capacitor with interposer is placed in such a way that the surface (bottom side) of each second conductor pad 23-2 contacts the applied cream solder, after which the cream solder is melted by the reflow soldering method or other heat treatment and then cured, to join each second conductor pad 23-2 to each conductor pad 32 of the substrate 30 via solder SOL (refer to FIG. 14). It should be noted that each conductor pad 32 of the substrate 30 has a roughly rectangular profile slightly larger than that of the bottom side of each second conductor pad 23-2.

Because each conductor via 24 of the interposer 20-2 of the capacitor with interposer is positioned on the inner side of the outer edge of each second conductor pad 23-2 and also because a void GA not filled with solder SOL is present in the through hole 24a of each conductor via 24 on the surface side (bottom side) of each second conductor pad 23-2 (refer to FIG. 12), at the time of the aforementioned placement any excess cream solder is taken at least partially into the void GA in each through hole 24a, and consequently the void GA in each through hole 24a is filled with solder SOL by the time the production process is over. In other words, because any excess cream solder can be taken at least partially into the void GA in each through hole 24a at the time of the aforementioned placement, the amount of cream solder oozing out to the end face side of the interposer 20-2 in its length direction can be reduced and wetting of the end face of each external electrode 12 of the capacitor 10 by molten solder traveling along the end face of the interposer 20-2 in its length direction can be prevented as much as possible, and consequently formation of the fillet SOLa shown in FIG. 3 can be avoided as much as possible.

In FIG. 14, solder SOL is filled in a manner filling the entire void GA of each through hole 24a (refer to FIG. 12), and although it varies depending on the bore of each through hole 24a, the amount of cream solder applied, and so on, the amount of solder SOL filled in the void GA of each conductor via 24 by the time the production process is over generally falls in a range of 3 to 100% relative to the total volume of each void GA. This means that, when this percentage is 100%, solder SOL is filled in a manner filling the entire void GA of each through hole 24a, as shown in FIG. 14, which is beneficial in that the joining strength of the capacitor with interposer to the substrate 30 increases due to the solder SOL filled roughly densely in each through hole 24a. If the percentage is less than 100%, on the other hand, space not filled with solder SOL remains in the void GA in each through hole 24a; however, each external electrode 12 of the capacitor 10 can still be electrically connected to each conductor pad 32 of the substrate 30 appropriately through each first conductor pad 22-2, each conductor via 24, and each second conductor pad 23-2 of the interposer 20-2.

In essence, effects that are roughly the same as those described in [First Embodiment (FIG. 4 to FIG. 8)] above can also be achieved with the capacitor with interposer shown in FIG. 12.

Figure 15:
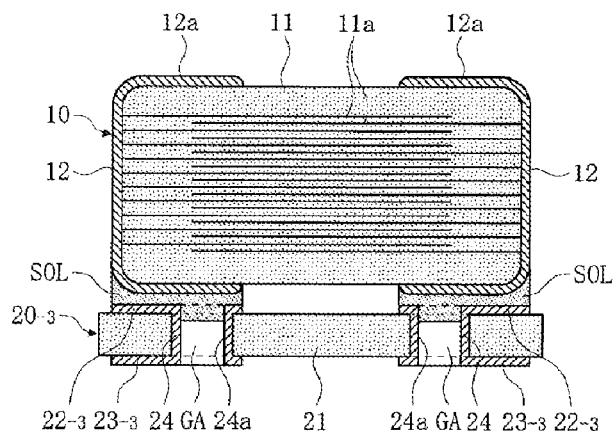
FIG. 15 is a longitudinal section view of a multilayer ceramic capacitor with interposer constituting a fourth embodiment of the present invention.
Figure 16:
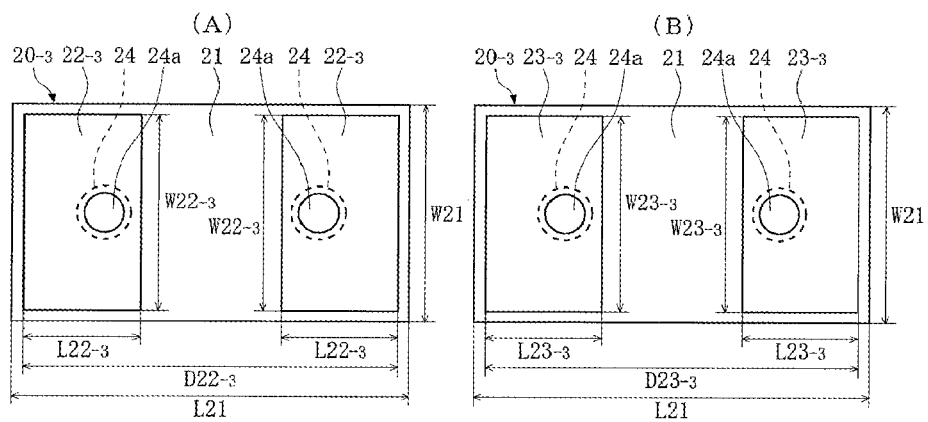
FIG. 16 (A) is a top view of the interposer shown in FIG. 15, while FIG. 16 (B) is a bottom view of the interposer shown in FIG. 15.
Figure 17:
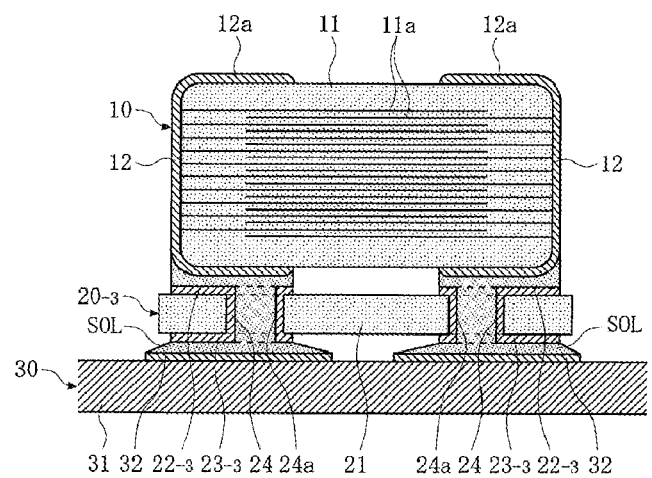
FIG. 17 is a longitudinal section view of the multilayer ceramic capacitor with interposer shown in FIG. 15, being mounted on a substrate.

Fourth Embodiment (FIG. 15 to FIG. 17)

FIG. 15 is a longitudinal section view of a multilayer ceramic capacitor with interposer constituting the fourth embodiment of the present invention, FIG. 16 (A) is a top view of the interposer shown in FIG. 15, while FIG. 16 (B) is a bottom view of the interposer shown in FIG. 15, and FIG. 17 is a longitudinal section view of the multilayer ceramic capacitor with interposer shown in FIG. 15, being mounted on a substrate.

It should be noted that, in the explanations provided herein, a multilayer ceramic capacitor with interposer is simply referred to as "capacitor with interposer," while a multilayer ceramic capacitor is simply referred to as "capacitor," for the sake of convenience of description. Additionally, the dimension in the lateral direction in FIG. 15 and FIG. 16 is referred to as "length," the dimension in the vertical direction in FIG. 16 is referred to as "width," and the dimension in the vertical direction in FIG. 15 is referred to as "height."

The capacitor with interposer shown in FIG. 15 comprises a capacitor 10, interposer 20-3, and solder SOL joining the two. This capacitor with interposer is constitutionally different from the capacitor with interposer shown in FIG. 4 and FIG. 5 (first embodiment) in that, as shown in FIG. 16, each conductor via 24 of the interposer 20-3 has been moved outward and the overhang part 22a of roughly semi-circular shape (refer to FIG. 6 (A)) has been removed from each first conductor pad 22-3 and also the overhang part 23a of roughly semi-circular shape (refer to FIG. 6 (B)) has been removed from each second conductor pad 23-3. It should be noted that the length L22-3 and width W22-3 of each first conductor pad 22-3 are the same as the length L22 and width W22 shown in FIG. 6 (A), the outermost end distance D22-3 between the two first conductor pads 22-3 is the same as the outermost end distance D22 shown in FIG. 6 (A), the length L23-3 and width W23-3 of each second conductor pad 23-3 are the same as the length L23 and width W23 shown in FIG. 6 (B), and the outermost end distance D23-3 between the two second conductor pads 23-3 is the same as the outermost end distance D23 shown in FIG. 6 (B).

To produce the capacitor with interposer shown in FIG. 15, cream solder is applied to the surface (top side) of each first conductor pad 22-3 of the interposer 20-3 and the capacitor 10 is placed in such a way that one side face (bottom side) of roughly rectangular shape of each external electrode 12 contacts the applied cream solder, after which the cream solder is melted by the reflow soldering method or other heat treatment and then cured, to join each external electrode 12 to each first conductor pad 22-3 of the interposer 20-3 via solder SOL.

Because each conductor via 24 of the interposer 20-3 is positioned on the inner side of the outer edge of each first conductor pad 22-3 and also because each conductor via 24 has a through hole 24a inside, at the time of the aforementioned placement any excess cream solder is taken at least partially into each through hole 24a on the surface side (top side) of the first conductor pad 22-3, and this means that, by the time the production process is over, solder SOL is slightly filled in each through hole 24a on the surface side (top side) of each first conductor pad 22-3, while a void GA not filled with solder SOL is formed in each through hole 24a on the surface side (bottom side) of the second conductor pad 23-3. In other words, because any excess cream solder can be taken at least partially into each through hole 24a on the surface side (top side) of the first conductor pad 22-3 at the time of the aforementioned placement, the amount of cream solder oozing out to the end face side of each external electrode 12 of the capacitor 10 can be reduced and wetting of the end face of each external electrode 12 of the capacitor 10 by molten solder can be prevented as much as possible.

Although it varies depending on the bore of each through hole 24a, the amount of cream solder applied, and so on, the amount of solder SOL filled in the through hole 24a of each conductor via 24 by the time the production process is over generally falls in a range of 3 to 50% relative to the total volume of each through hole 24a. As a result, the percentage of the volume of the void GA to the total volume of each through hole 24a generally falls in a range of 50 to 97%.

On the other hand, to mount the capacitor with interposer shown in FIG. 15 on the substrate 30, cream solder is applied to the surface (top side) of each of the two conductor pads 32 provided on the surface (top side) of the substrate body 31 and the capacitor with interposer is placed in such a way that the surface (bottom side) of each second conductor pad 23-3 contacts the applied cream solder, after which the cream solder is melted by the reflow soldering method or other heat treatment and then cured, to join each second conductor pad 23-3 to each conductor pad 32 of the substrate 30 via solder SOL (refer to FIG. 17). It should be noted that each conductor pad 32 of the substrate 30 has a roughly rectangular profile slightly larger than that of the bottom side of each second conductor pad 23-3.

Because each conductor via 24 of the interposer 20-3 of the capacitor with interposer is positioned on the inner side of the outer edge of each second conductor pad 23-3 and also because a void GA not filled with solder SOL is present in the through hole 24a of each conductor via 24 on the surface side (bottom side) of each second conductor pad 23-3 (refer to FIG. 15), at the time of the aforementioned placement any excess cream solder is taken at least partially into the void GA in each through hole 24a, and consequently the void GA in each through hole 24a is filled with solder SOL by the time the production process is over. In other words, because any excess cream solder can be taken at least partially into the void GA in each through hole 24a at the time of the aforementioned placement, the amount of cream solder oozing out to the end face side of the interposer 20-3 in its length direction can be reduced and wetting of the end face of each external electrode 12 of the capacitor 10 by molten solder traveling along the end face of the interposer 20-3 in its length direction can be prevented as much as possible, and consequently formation of the fillet SOLa shown in FIG. 3 can be avoided as much as possible.

In FIG. 17, solder SOL is filled in a manner filling the entire void GA of each through hole 24a (refer to FIG. 15), and although it varies depending on the bore of each through hole 24a, the amount of cream solder applied, and so on, the amount of solder SOL filled in the void GA of each conductor via 24 by the time the production process is over generally falls in a range of 3 to 100% relative to the total volume of each void GA. This means that, when this percentage is 100%, solder SOL is filled in a manner filling the entire void GA of each through hole 24a, as shown in FIG. 17, which is beneficial in that the joining strength of the capacitor with interposer to the substrate 30 increases due to the solder SOL filled roughly densely in each through hole 24a. If the percentage is less than 100%, on the other hand, space not filled with solder SOL remains in the void GA in each through hole 24a; however, each external electrode 12 of the capacitor 10 can still be electrically connected to each conductor pad 32 of the substrate 30 appropriately through each first conductor pad 22-3, each conductor via 24, and each second conductor pad 23-3 of the interposer 20-3.

In essence, effects that are roughly the same as those described in [First Embodiment (FIG. 4 to FIG. 8)] above can also be achieved with the capacitor with interposer shown in FIG. 15.

Figure 18:
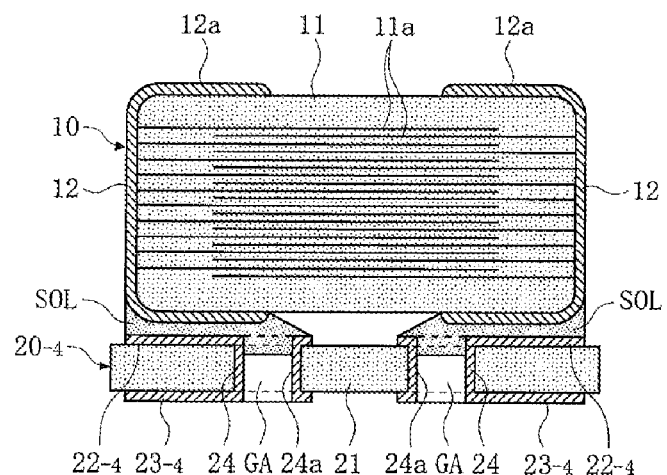
FIG. 18 is a longitudinal section view of a multilayer ceramic capacitor with interposer constituting a fifth embodiment of the present invention.
Figure 19:
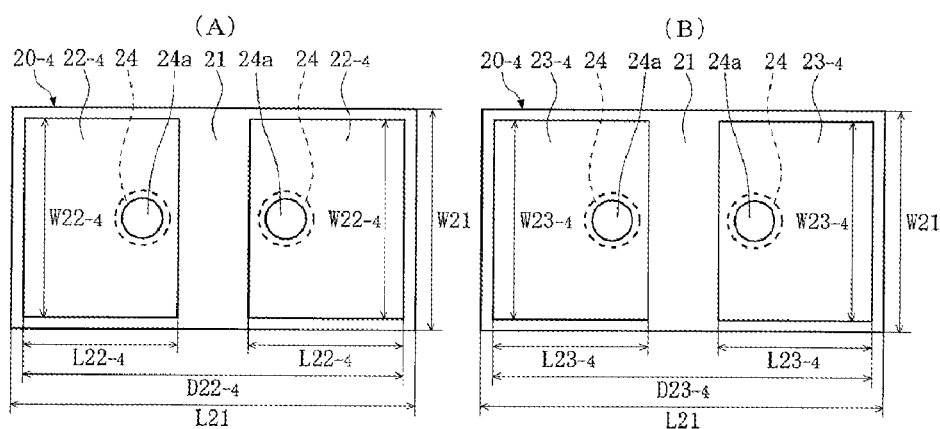
FIG. 19 (A) is a top view of the interposer shown in FIG. 18, while FIG. 19 (B) is a bottom view of the interposer shown in FIG. 18.
Figure 20:
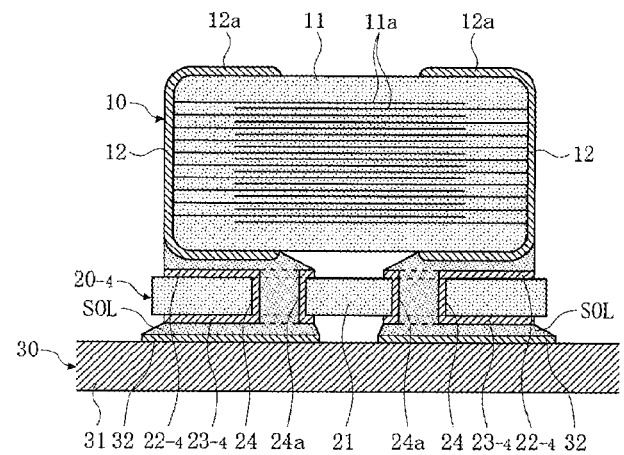
FIG. 20 is a longitudinal section view of the multilayer ceramic capacitor with interposer shown in FIG. 18, being mounted on a substrate.

Fifth Embodiment (FIG. 18 to FIG. 20)

FIG. 18 is a longitudinal section view of a multilayer ceramic capacitor with interposer constituting the fifth embodiment of the present invention, FIG. 19 (A) is a top view of the interposer shown in FIG. 18, while FIG. 19 (B) is a bottom view of the interposer shown in FIG. 18, and FIG. 20 is a longitudinal section view of the multilayer ceramic capacitor with interposer shown in FIG. 18, being mounted on a substrate.

It should be noted that, in the explanations provided herein, a multilayer ceramic capacitor with interposer is simply referred to as "capacitor with interposer," while a multilayer ceramic capacitor is simply referred to as "capacitor," for the sake of convenience of description. Additionally, the dimension in the lateral direction in FIG. 18 and FIG. 19 is referred to as "length," the dimension in the vertical direction in FIG. 19 is referred to as "width," and the dimension in the vertical direction in FIG. 18 is referred to as "height."

The capacitor with interposer shown in FIG. 18 comprises a capacitor 10, interposer 20-4, and solder SOL joining the two. This capacitor with interposer is constitutionally different from the capacitor with interposer shown in FIG. 4 and FIG. 5 (first embodiment) in that, as shown in FIG. 19, the length L22-4 of each first conductor pad 22-4 and length L23-4 of each second conductor pad 23-4 of the interposer 20-4 have been increased and the overhang part 22a of roughly semi-circular shape (refer to FIG. 6 (A)) has been removed from each first conductor pad 22-4 and also the overhang part 23a of roughly semi-circular shape (refer to FIG. 6 (B)) has been removed from each second conductor pad 23-4. It should be noted that the width W22-4 of each first conductor pad 22-4 is the same as the width W22 shown in FIG. 6 (A), the outermost end distance D22-4 between the two first conductor pads 22-4 is the same as the outermost end distance D22 shown in FIG. 6 (A), the width W23-4 of each second conductor pad 23-4 is the same as the width W23 shown in FIG. 6 (B), and the outermost end distance D23-4 between the two second conductor pads 23-4 is the same as the outermost end distance D23 shown in FIG. 6 (B).

To produce the capacitor with interposer shown in FIG. 18, cream solder is applied to the surface (top side) of each first conductor pad 22-4 of the interposer 20-4 and the capacitor 10 is placed in such a way that one side face (bottom side) of roughly rectangular shape of each external electrode 12 contacts the applied cream solder, after which the cream solder is melted by the reflow soldering method or other heat treatment and then cured, to join each external electrode 12 to each first conductor pad 22-4 of the interposer 20-4 via solder SOL.

Because each conductor via 24 of the interposer 20-4 is positioned on the inner side of the outer edge of each first conductor pad 22-4 and also because each conductor via 24 has a through hole 24a inside, at the time of the aforementioned placement any excess cream solder is taken at least partially into each through hole 24a on the surface side (top side) of the first conductor pad 22-4, and this means that, by the time the production process is over, solder SOL is slightly filled in each through hole 24a on the surface side (top side) of each first conductor pad 22-4, while a void GA not filled with solder SOL is formed in each through hole 24a on the surface side (bottom side) of the second conductor pad 23-4. In other words, because any excess cream solder can be taken at least partially into each through hole 24a on the surface side (top side) of the first conductor pad 22-4 at the time of the aforementioned placement, the amount of cream solder oozing out to the end face side of each external electrode 12 of the capacitor 10 can be reduced and wetting of the end face of each external electrode 12 of the capacitor 10 by molten solder can be prevented as much as possible.

Although it varies depending on the bore of each through hole 24a, the amount of cream solder applied, and so on, the amount of solder SOL filled in the through hole 24a of each conductor via 24 by the time the production process is over generally falls in a range of 3 to 50% relative to the total volume of each through hole 24a. As a result, the percentage of the volume of the void GA to the total volume of each through hole 24a generally falls in a range of 50 to 97%.

Additionally, to mount the capacitor with interposer shown in FIG. 18 on the substrate 30, cream solder is applied to the surface (top side) of each of the two conductor pads 32 provided on the surface (top side) of the substrate body 31 and the capacitor with interposer is placed in such a way that the surface (bottom side) of each second conductor pad 23-4 contacts the applied cream solder, after which the cream solder is melted by the reflow soldering method or other heat treatment and then cured, to join each second conductor pad 23-4 to each conductor pad 32 of the substrate 30 via solder SOL (refer to FIG. 20). It should be noted that each conductor pad 32 of the substrate 30 has a roughly rectangular profile slightly larger than that of the bottom side of each second conductor pad 23-4.

Because each conductor via 24 of the interposer 20-4 of the capacitor with interposer is positioned on the inner side of the outer edge of each second conductor pad 23-4 and also because a void GA not filled with solder SOL is present in the through hole 24a of each conductor via 24 on the surface side (bottom side) of each second conductor pad 23-4 (refer to FIG. 18), at the time of the aforementioned placement any excess cream solder is taken at least partially into the void GA in each through hole 24a, and consequently the void GA in each through hole 24a is filled with solder SOL by the time the production process is over. In other words, because any excess cream solder can be taken at least partially into the void GA in each through hole 24a at the time of the aforementioned placement, the amount of cream solder oozing out to the end face side of the interposer 20-4 in its length direction can be reduced and wetting of the end face of each external electrode 12 of the capacitor 10 by molten solder traveling along the end face of the interposer 20-4 in its length direction can be prevented as much as possible, and consequently formation of the fillet SOLa shown in FIG. 3 can be avoided as much as possible.

In FIG. 20, solder SOL is filled in a manner filling the entire void GA of each through hole 24a (refer to FIG. 18), and although it varies depending on the bore of each through hole 24a, the amount of cream solder applied, and so on, the amount of solder SOL filled in the void GA of each conductor via 24 by the time the production process is over generally falls in a range of 3 to 100% relative to the total volume of each void GA. This means that, when this percentage is 100%, solder SOL is filled in a manner filling the entire void GA of each through hole 24a, as shown in FIG. 20, which is beneficial in that the joining strength of the capacitor with interposer to the substrate 30 increases due to the solder SOL filled roughly densely in each through hole 24a. If the percentage is less than 100%, on the other hand, space not filled with solder SOL remains in the void GA in each through hole 24a; however, each external electrode 12 of the capacitor 10 can still be electrically connected to each conductor pad 32 of the substrate 30 appropriately through each first conductor pad 22-4, each conductor via 24, and each second conductor pad 23-4 of the interposer 20-4.

In essence, effects that are roughly the same as those described in [First Embodiment (FIG. 4 to FIG. 8)] above can also be achieved with the capacitor with interposer shown in FIG. 18.

Other Embodiments (1) Although the capacitor 10 illustrated in [First Embodiment (FIG. 4 to FIG. 8)], [Second Embodiment (FIG. 9 to FIG. 11)], [Third Embodiment (FIG. 12 to FIG. 14)], [Fourth Embodiment (FIG. 15 to FIG. 17)] and [Fifth Embodiment (FIG. 18 to FIG. 20)] has the basic dimensions of Length>Width=Height, a capacitor having the basic dimensions of Length>Width>Height can also be used to still achieve effects that are roughly the same as those described in [First Embodiment (FIG. 4 to FIG. 8)] above.

(2) Although the width W22, W22-1 to W22-4 of each first conductor pad 22, 22-1 to 22-4 and width W23, W23-2 to W23-4 of each second conductor pad 23, 23-2 to 23-4 of the interposer 20, 20-1 to 20-4 are roughly the same as the width W12 of each external electrode 12 of the capacitor 10 in [First Embodiment (FIG. 4 to FIG. 8)], [Second Embodiment (FIG. 9 to FIG. 11)], [Third Embodiment (FIG. 12 to FIG. 14)], [Fourth Embodiment (FIG. 15 to FIG. 17)] and [Fifth Embodiment (FIG. 18 to FIG. 20)], the respective widths W22, W22-1 to W22-4 and W23, W23-2 to W23-4 can be set wider than the width W12 of each external electrode 12 of the capacitor 12, or the respective widths W22, W22-1 to W22-4 and W23, W23-2 to W23-4 can also be set roughly the same as the width W21 of the insulated substrate 21, to still achieve effects that are roughly the same as those described in [First Embodiment (FIG. 4 to FIG. 8)] above.

(3) Although each first conductor pad 22, 22-1 to 22-4 of the interposer 20, 20-1 to 20-4 is connected to each second conductor pad 23, 23-2 to 23-4 using one conductor via 24 in [First Embodiment (FIG. 4 to FIG. 8)], [Second Embodiment (FIG. 9 to FIG. 11)], [Third Embodiment (FIG. 12 to FIG. 14)], [Fourth Embodiment (FIG. 15 to FIG. 17)] and [Fifth Embodiment (FIG. 18 to FIG. 20)], two or more conductor vias 24 can also be provided in the insulated substrate 21 in a manner penetrating through it in its thickness direction, with the two or more conductor vias 24 used to connect each first conductor pad 22, 22-1 to 22-4 and each second conductor pad 23, 23-2 to 23-4 to still achieve effects that are roughly the same as those described in [First Embodiment (FIG. 4 to FIG. 8)] above. In addition, although the conductor via 24 illustrated forms a roughly cylindrical shape and has a through hole 24a of roughly columnar shape inside, the lateral cross-section of the conductor via 24 can also have an oval, polygonal, or other non-cylindrical shape and the lateral cross-section of the through hole 24a can also have an oval, polygonal, or other non-columnar shape, to still achieve effects that are roughly the same as those described in [First Embodiment (FIG. 4 to FIG. 8)] above.

(4) Although each conductor via 24 of the interposer 20, 20-1 to 20-4 is arranged in such a way that the center of each conductor via 24 becomes closer to the center of the insulated substrate 21 in its length direction than to the center of each first conductor pad 22, 22-1 to 22-4 in its length direction and the center of each second conductor pad 23, 23-2 to 23-4 in its length direction, effects that are roughly the same as those described in [First Embodiment (FIG. 4 to FIG. 8)] above can also be achieved so long as each conductor via 24 is provided on the inner side of the outer edge of each first conductor pad 22, 22-1 to 22-4 and of the outer edge of each second conductor pad 23, 23-2 to 23-4.

Figure 21:
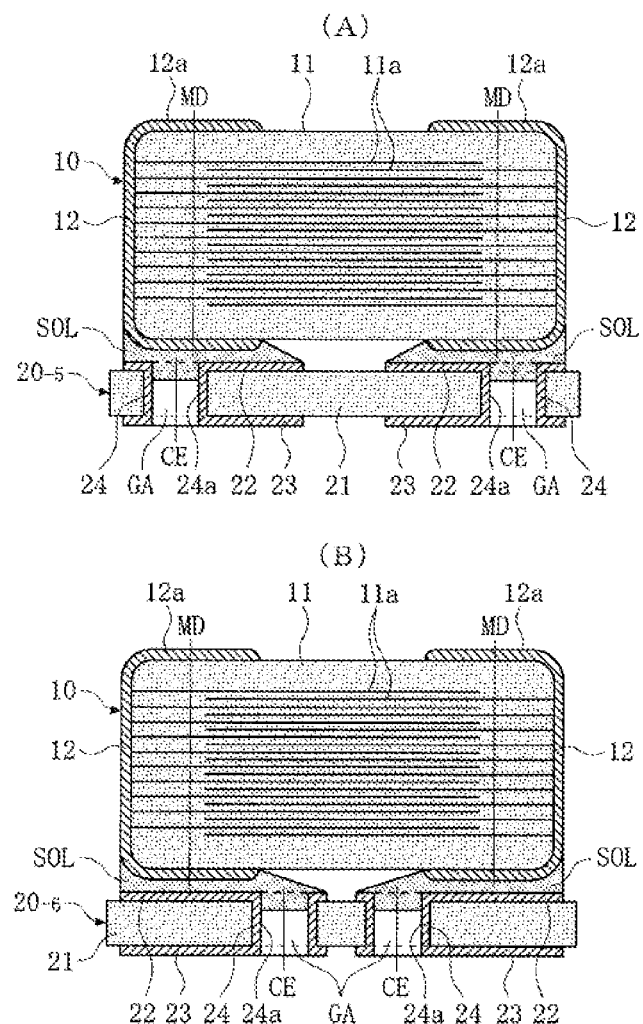
FIG. 21 (A) and FIG. 21 (B) are longitudinal section views of multilayer ceramic capacitors with interposer illustrating other embodiments of the interposer.

For example, as is the case of an interposer 20-5 illustrated in FIG. 21 (A), each conductor via 24 of the interposer 20 explained in [First Embodiment (FIG. 4 to FIG. 8)] above can also be arranged in such a way that the center of each conductor via 24 becomes closer to the outer side of the insulated substrate 21 in its length direction than to the center of each first conductor pad 22, 22-1 to 22-4 in its length direction and to the center of each second conductor pad 23, 23-2 to 23-4 in its length direction, to still achieve effects that are roughly the same as those described in [First Embodiment (FIG. 4 to FIG. 8)] above. In addition, as is the case of an interposer 20-6 illustrated in FIG. 21 (B), each conductor via 24 of the interposer 20 explained in [First Embodiment (FIG. 4 to FIG. 8)] above can also be arranged in such a way that it comes as close as possible to the center of the insulated substrate 21 in its length direction so the conductor via 24 does not face each external electrode 12a of the capacitor 10, to still achieve effects that are roughly the same as those described in [First Embodiment (FIG. 4 to FIG. 8)] above.

Supplemental information is provided below regarding the position of each conductor via 24 of the interposer 20, 20-1 to 20-6. As mentioned earlier, the stress transmitted to the substrate 30 from the capacitor 10 when electrostriction occurs in the dielectric chip 11 can be mitigated by the interposer 20, 20-1 to 20-6 present between the two. The factors that trigger this mitigating action include "damping based on transmission distance" and "damping based on deformation such as extension/contraction," and to cause the latter, or "damping based on deformation such as extension/contraction," to occur effectively, preferably each conductor via 24 is arranged closer to the center of the insulated substrate 21 in its length direction.

To be specific, when each conductor via 24 is arranged closer to the outer side of the insulated substrate 21 in its length direction, the aforementioned "damping based on deformation such as extension/contraction" may be suppressed by the conductor via 24 if, for example, the interposer 20-5 shown in FIG. 21 (A) is used. When each conductor via 24 is arranged closer to the center of the insulated substrate 21 in its length direction, on the other hand, the aforementioned "damping based on deformation such as extension/contraction" can occur effectively in the area where the external electrodes 12 of the capacitor 10 face each other, in order to more appropriately mitigate the stress transmitted to the substrate 30 from the capacitor 10 and thereby help suppress noise due to electrostriction, if the interposer 20, 20-1 to 20-6 shown in FIG. 5, FIG. 9, FIG. 12, FIG. 15, FIG. 18 or FIG. 21 (B), especially the interposer 20-6 shown in FIG. 21 (B), is used.

DESCRIPTION OF THE SYMBOLS

10 - - - Multilayer ceramic capacitor, 11 - - - Dielectric chip, 11a - - - Internal electrode layer, 12 - - - External electrode, 12a - - - Side face part of external electrode, 20, 20-1 to 20-6 - - - Interposer, 22, 22-1 to 22-4 - - - First conductor pad, 23, 23-2 to 23-4 - - - Second conductor pad, 24 - - - Conductor via, 24a - - - Through hole, SOL - - - Solder, GA - - - Void

What is claimed is:

1. A multilayer ceramic capacitor with interposer comprising a multilayer ceramic capacitor and an interposer installed on it, wherein:

(1) the multilayer ceramic capacitor is structured in such a way that it has: a dielectric chip of roughly rectangular solid shape that houses multiple internal electrode layers stacked in a manner not contacting each other; and two external electrodes each provided on one of opposite end faces of the dielectric chip in a manner partially covering four side faces adjoining the end face and where an area partially covering the four side faces has four side faces of roughly rectangular shape; wherein ends of some of the multiple internal electrode layers are connected to one of the two external electrodes, while ends of the others are connected to the other of the two external electrodes;

(2) the interposer is structured in such a way that it has:
an insulated substrate of roughly rectangular sheet shape;
two first conductor pads of roughly rectangular shape provided on one side of the insulated substrate in its thickness direction in a manner each having a mounting area on which one side face of roughly rectangular shape of each of the two external electrodes is mounted via solder;
two second conductor pads provided on the other side of the insulated substrate in its thickness direction in a manner facing the two first conductor pads via the insulated substrate, respectively;
one or more one-side conductor vias provided in the mounting area of one of the two first conductor pads in a manner penetrating through the insulated substrate in its thickness direction, at a location(s) on an inner side of an outer edge of the one of the two first conductor pads and of an outer edge of one of the two second conductor pads, wherein the one or more one-side conductor vias each have a void through hole inside that opens at a first surface of the one of the two first conductor pads and at a second surface of the one of the two second conductor pads, each via with the void through hole being conductive from the first surface to the second surface; and
one or more other-side conductor vias provided in the mounting area of the other of the two first conductor pads in a manner penetrating through the insulated substrate in its thickness direction, at a location(s) on an inner side of an outer edge of the other of the two first conductor pads and of an outer edge of the other of the two second conductor pads, wherein the one or more other-side conductor vias each have a void through hole inside that opens at a first surface of the other of the two first conductor pads and at a second surface of the other of the two second conductor pads, each via with the void through hole being conductive from the first surface to the second surface;
wherein the one of the two first conductor pads is connected to the one of the two second conductor pads via the one or more one-side conductor vias, while the other of the two first conductor pads is connected to the other of the two second conductor pads via the one or more other-side conductor vias;

(3) the two first conductor pads of the interposer each have joined to its surface in the mounting area, via solder, the one side face of roughly rectangular shape of each of the two external electrodes of the multilayer ceramic capacitor; and (4) voids not filled with the solder are present in the void through hole(s) of the one or more one-side conductor vias on the surface side of the one of the two second conductor pads, and also in the void through hole(s) of the one or more other-side conductor vias on the surface side of the other of the two second conductor pads, whereas the void through holes of the one or more one-side conductor vias and the one or more other-side conductor vias are filled with the solder on the surface side of the two first conductor pads.

2. A multilayer ceramic capacitor with interposer according to claim 1, wherein, when a direction specifying an outermost end distance between the two first conductor pads of the interposer represents a length direction, then the outermost end distance between the two first conductor pads and a length of the insulated substrate have a dimensional relationship of "Outermost end distance≤Insulated substrate length".

3. A multilayer ceramic capacitor with interposer according to claim 1, wherein an outermost end distance between the two first conductor pads of the interposer and an end face distance between the two external electrodes of the multilayer ceramic capacitor have a dimensional relationship of "Outermost end distance≤External electrode end face distance".

4. A multilayer ceramic capacitor with interposer according to claim 1, wherein, when a direction specifying an outermost end distance between the two second conductor pads of the interposer represents a length direction, then the outermost end distance between the two second conductor pads and a length of the insulated substrate have a dimensional relationship of "Outermost end distance≤Insulated substrate length".

5. An interposer for a multilayer ceramic capacitor, adapted to be used for mounting the multilayer ceramic capacitor on a substrate, wherein:

(1) the multilayer ceramic capacitor is structured in such a way that it has: a dielectric chip of roughly rectangular solid shape that houses multiple internal electrode layers stacked in a manner not contacting each other; and two external electrodes each provided on one of opposite end faces of the dielectric chip in a manner partially covering four side faces adjoining the end face and where an area partially covering the four side faces has four side faces of roughly rectangular shape; wherein ends of some of the multiple internal electrode layers are connected to one of the two external electrodes, while ends of the others are connected to the other of the two external electrodes;

(2) the interposer is structured in such a way that it has:
an insulated substrate of roughly rectangular sheet shape;
two first conductor pads of roughly rectangular shape provided on one side of the insulated substrate in its thickness direction in a manner each having a mounting area on which one side face of roughly rectangular shape of each of the two external electrodes is mounted via solder;
two second conductor pads provided on the other side of the insulated substrate in its thickness direction in a manner facing the two first conductor pads via the insulated substrate, respectively;
one or more one-side conductor vias provided in the mounting area of one of the two first conductor pads in a manner penetrating through the insulated substrate in its thickness direction, on an inner side of an outer edge of the one of the two first conductor pads and of an outer edge of one of the two second conductor pads, wherein the one or more one-side conductor vias each have a void through hole inside that opens at a first surface of the one of the two first conductor pads and at a second surface of the one of the two second conductor pads, each via with the void through hole being conductive from the first surface to the second surface; and
one or more other-side conductor vias provided in the mounting area of the other of the two first conductor pads in a manner penetrating through the insulated substrate in its thickness direction, on an inner side of an outer edge of the other of the two first conductor pads and of an outer edge of the other of the two second conductor pads, wherein the one or more other-side conductor vias each have a void through hole inside that opens at a first surface of the other of the two first conductor pads and at a second surface of the other of the two second conductor pads, each via with the void through hole being conductive from the first surface to the second surface;
wherein the one of the two first conductor pads is connected to the one of the two second conductor pads via the one or more one-side conductor vias, while the other of the two first conductor pads is connected to the other of the two second conductor pads via the one or more other-side conductor vias; and (3) the two first conductor pads of the interposer are each used to join in the mounting area, via solder, the one side face of roughly rectangular shape of each of the two external electrodes of the multilayer ceramic capacitor.

6. An interposer for a multilayer ceramic capacitor according to claim 5, wherein, when a direction specifying an outermost end distance between the two first conductor pads of the interposer represents a length direction, then the outermost end distance between the two first conductor pads and a length of the insulated substrate have a dimensional relationship of "Outermost end distance≤Insulated substrate length".

7. An interposer for a multilayer ceramic capacitor according to claim 5, wherein an outermost end distance between the two first conductor pads of the interposer and an end face distance between the two external electrodes of the multilayer ceramic capacitor have a dimensional relationship of "Outermost end distance≤External electrode end face distance".

8. An interposer for a multilayer ceramic capacitor according to claim 5, wherein, when a direction specifying an outermost end distance between the two second conductor pads of the interposer represents a length direction, then the outermost end distance between the two second conductor pads and a length of the insulated substrate have a dimensional relationship of "Outermost end distance≤Insulated substrate length".

9. A multilayer ceramic capacitor with interposer according to claim 2, wherein an outermost end distance between the two first conductor pads of the interposer and an end face distance between the two external electrodes of the multilayer ceramic capacitor have a dimensional relationship of "Outermost end distance≤External electrode end face distance".

10. A multilayer ceramic capacitor with interposer according to claim 2, wherein, when a direction specifying an outermost end distance between the two second conductor pads of the interposer represents a length direction, then the outermost end distance between the two second conductor pads and a length of the insulated substrate have a dimensional relationship of "Outermost end distance≤Insulated substrate length".

11. A multilayer ceramic capacitor with interposer according to claim 3, wherein, when a direction specifying an outermost end distance between the two second conductor pads of the interposer represents a length direction, then the outermost end distance between the two second conductor pads and a length of the insulated substrate have a dimensional relationship of "Outermost end distance≤Insulated substrate length".

12. A multilayer ceramic capacitor with interposer according to claim 9, wherein, when a direction specifying an outermost end distance between the two second conductor pads of the interposer represents a length direction, then the outermost end distance between the two second conductor pads and a length of the insulated substrate have a dimensional relationship of "Outermost end distance≤Insulated substrate length".

13. An interposer for a multilayer ceramic capacitor according to claim 6, wherein an outermost end distance between the two first conductor pads of the interposer and an end face distance between the two external electrodes of the multilayer ceramic capacitor have a dimensional relationship of "Outermost end distance≤External electrode end face distance".

14. An interposer for a multilayer ceramic capacitor according to claim 6, wherein, when a direction specifying an outermost end distance between the two second conductor pads of the interposer represents a length direction, then the outermost end distance between the two second conductor pads and a length of the insulated substrate have a dimensional relationship of "Outermost end distance≤Insulated substrate length".

15. An interposer for a multilayer ceramic capacitor according to claim 7, wherein, when a direction specifying an outermost end distance between the two conductor pads of the interposer represents a length direction, then the outermost end distance between the two second conductor pads and a length of the insulated substrate have a dimensional relationship of "Outermost end distance≤Insulated substrate length".

16. An interposer for a multilayer ceramic capacitor according to claim 13, wherein, when a direction specifying an outermost end distance between the two second conductor pads of the interposer represents a length direction, then the outermost end distance between the two second conductor pads and a length of the insulated substrate have a dimensional relationship of "Outermost end distance≤Insulated substrate length".

17. A multilayer ceramic capacitor with interposer according to claim 1, wherein the one or more one-side conductor vias and the one or more other-side conductor vias in the mounting areas are all vias connecting the two first conductor pads and the two second conductor pads, respectively.

18. An interposer for a multilayer ceramic capacitor according to claim 5, wherein the one or more one-side conductor vias and the one or more other-side conductor vias in the mounting areas are all vias connecting the two first conductor pads and the two second conductor pads, respectively.

* * * * *